United States Patent [19]

Wine

[11] 4,123,713

[45] Oct. 31, 1978

[54] MEMORY TYPE TUNING SYSTEM WITH PROVISIONS TO FACILITATE SETUP

[75] Inventor: Charles M. Wine, Princeton, N.J.

[73] Assignee: RCA Corporation, New York, N.Y.

[21] Appl. No.: 810,877

[22] Filed: Jun. 28, 1977

[51] Int. Cl.² .............................................. H04B 1/26
[52] U.S. Cl. ..................................... 325/455; 325/464
[58] Field of Search .............. 325/464, 465, 467, 468, 325/452, 455, 457, 459; 334/14, 15; 324/77 CS, 77 C

[56] References Cited

U.S. PATENT DOCUMENTS

| 3,845,394 | 10/1974 | Hamada | 325/464 |
| 3,893,049 | 7/1975 | Bray | 325/468 |
| 3,940,702 | 2/1976 | Yoshimura et al. | 325/464 |
| 4,061,982 | 12/1977 | Kawashima | 325/464 |

Primary Examiner—Robert L. Griffin
Assistant Examiner—Tommy P. Chin
Attorney, Agent, or Firm—Eugene M. Whitacre; Paul J. Rasmussen; Peter M. Emanuel

[57] ABSTRACT

In a memory type tuning system having memory locations for storing information corresponding to a limited number of preferred tuning positions, a display unit normally serving to display a number corresponding to a selected tuning position is selectively caused to display the letter F when all of the memory locations contain information corresponding to desired tuning positions and the letter E when all of the memory locations contain nondesired information.

11 Claims, 26 Drawing Figures

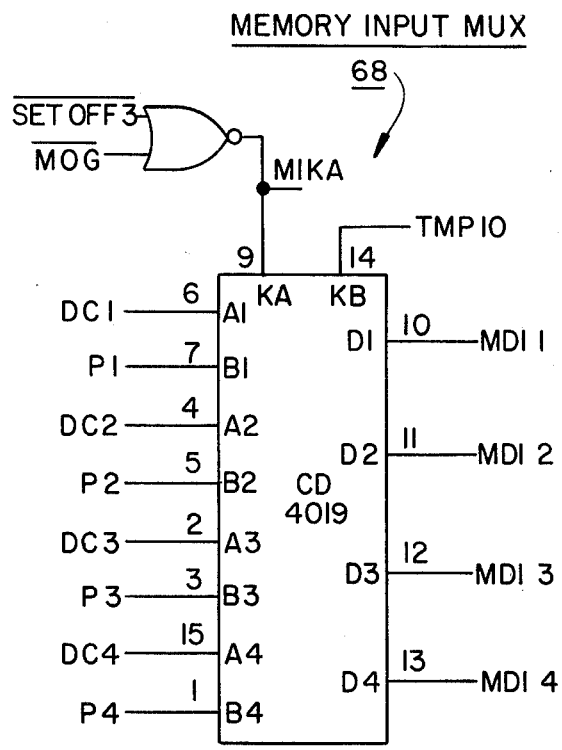
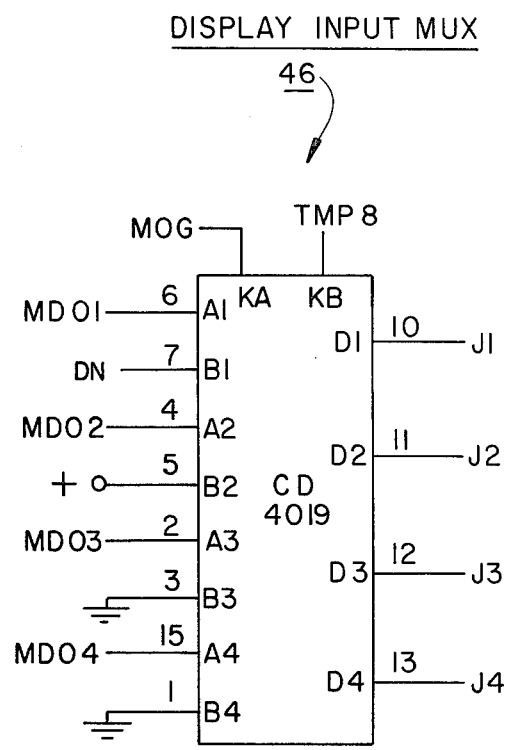
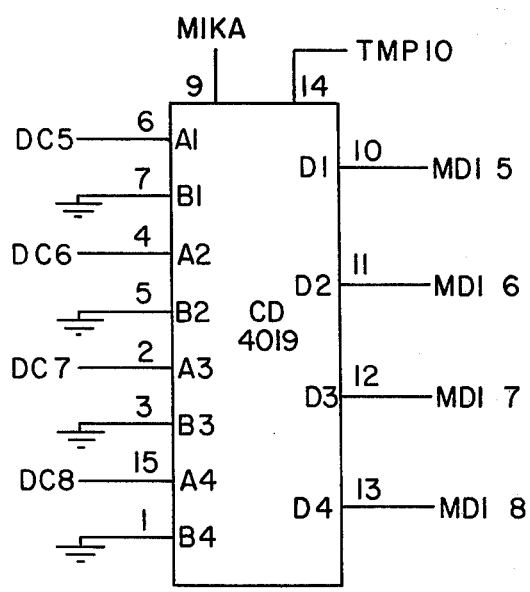
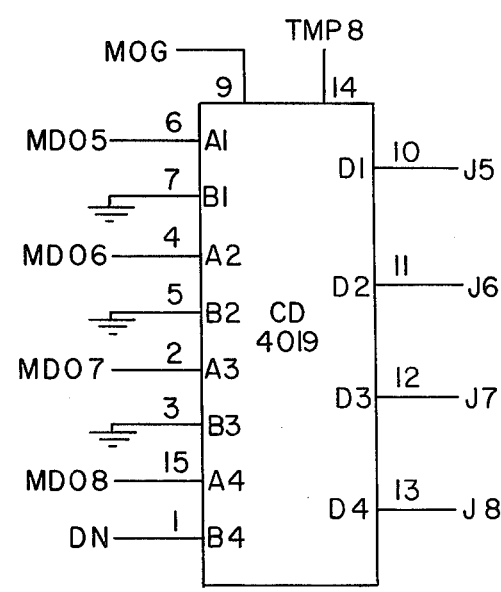
Fig. 3                           Fig. 4

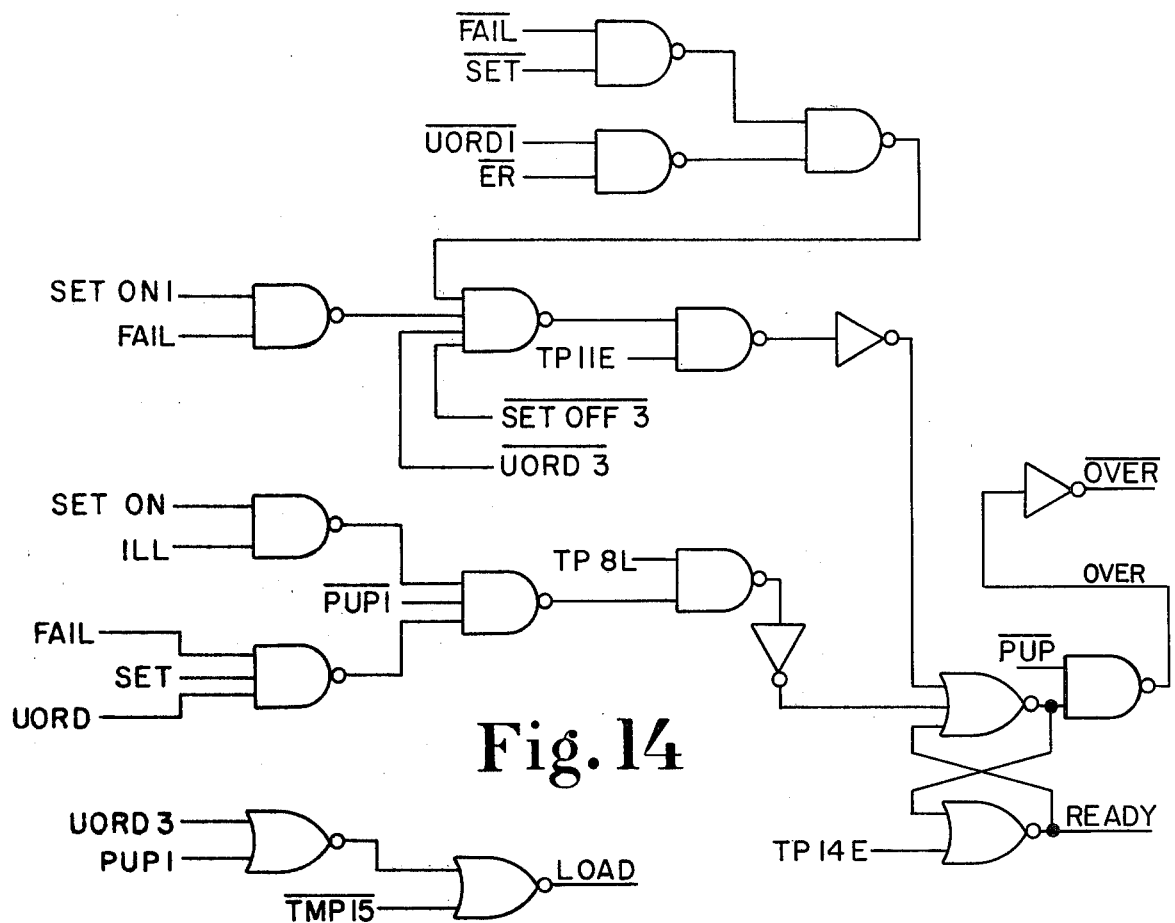
Fig. 14
Fig. 15
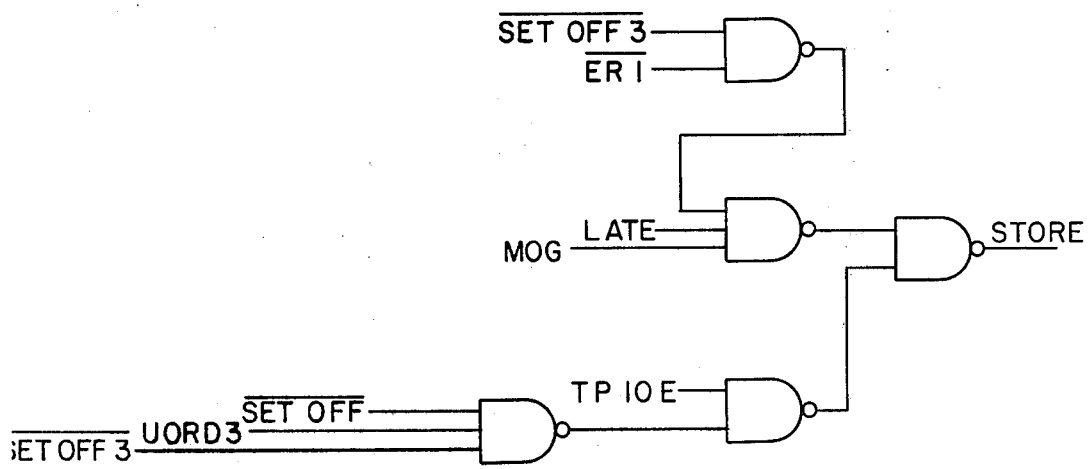
Fig. 16

| STATE / TMP | PUP | PUP1 | SET ON | SET ON 1 | UORD | UORD1 | UORD2 | UORD3 |
|---|---|---|---|---|---|---|---|---|
| 7 | | ILL→FAIL (EMPTY) | RESET POV | ILL→ DC=0 | RESET DOV | DC=DC±I (DCADV) FIX ILL DC | | |
| 8 | | READY | | ILL→ READY | SET•FAIL →READY | | | |
| 9 | RESET FAIL | | RESET FAIL | PC=PC+I (PCADV) | RESET FAIL | RESET FAIL | PC=PC+I RESET FAIL | |
| 10 | A=PUA PJAM | | | POV→FAIL (FULL) | | DOV→FAIL (EMPTY) | POV→FAIL | A=PUA STORE |
| 11 | | | | FAIL→ READY | | RESET POV FAIL→READY SET→READY | | READY |
| 12 | | | | | | | | |
| 13 | | | ↗ | | ↗ | | | |
| 14 | ↗ | LOAD | | | | ↗ | EQ ↗ FAIL ↘ EQ̄ | LOAD |
| 15 | | DCJAM | | DCJAM | | | | DCJAM |
| MOG 4-6 | | | | | | | | |

Fig.18a

| STATE / TMP | ER | ER1 | SET OFF | SET OFF 1 | SET OFF 2 | SET OFF 3 |
|---|---|---|---|---|---|---|
| 7 | SET→DC=0 RESET DOV | FORCE UP | RESET POV | | | |
| 8 | | | FAIL → GO TO PUP STATE | | | |
| 9 | | | | PC=PC+1 | | |
| 10 | | | A=PUA STORE | | (A=PUA) PJAM | (A=PUA) STORE |
| 11 | FAIL→READY SET→READY | | | | | READY |
| 12 | | | | | | |
| 13 | | | | | | |
| 14 | | GO TO UORDI STATE | | EQ POV | | |
| 15 | | M.INP MUX=0 STORE | | | | |
| MOG 4-6 | | | | | | STORE |

Fig. 18b

MEMORY TYPE TUNING SYSTEM WITH PROVISIONS TO FACILITATE SETUP

BACKGROUND OF THE INVENTION

The present invention relates to tuning systems for television receivers and the like including memories for storing information corresponding to various tuning positions.

Recently, a number of memory type tuning systems for television receivers which include memory locations for storing binary signals representing information corresponding to various tuning positions have been proposed. In these systems, upon the selection of a particular tuning position, the binary signals stored in the memory are "read out" and converted to display information for visually indicating the selected tuning position and tuning information for controlling the frequency of the receiver's local oscillator to tune the receiver to the selected tuning position. These memory type tuning systems have various forms. Some of these systems, such as the General Instrument Corporation "Omega" system described in an article entitled, "Digital Television Tuner Uses MOS LSI and Nonvolatile Memory" by Lester Penner appearing in the Apr. 1, 1976 issue of *Electronics,* provide enough memory locations for storing information corresponding to all the tuning positions in a predetermined tuning range. For example, in the United States at least 82 memory locations would be provided for the 82 channels comprising the conventional VHF and UHF television bands. In other memory type tuning systems, such as the Magnavox Videomatic Touch Tune Assembly described in the Magnavox Manual 7353, published by the Magnavox Company, Fort Wayne, Indiana, for the sake of economy, there are provided only enough memory locations to store information corresponding to a limited number of preferred tuning positions. Still other memory type tuning systems of various kinds are disclosed in U.S. Pat. Nos. 3,778,736; 3,882,400; 3,940,702; 3,953,801; 3,968,440; 3,968,443; 3,979,680; 3,990,027; 3,999,131; 4,023,107; laid open Japanese Patent Application 50-16044; and an article entitled, "Working with Microprocessors — Select the Station the Micro Way" appearing in the Apr. 13, 1977 issue of *Electronics Weekly.*

In those memory type tuning systems in which the memory contains enough memory locations to store information for a limited number of preferred tuning positions, it is necessary for a user to enter information for the preferred tuning positions into the memory because the preferred tuning positions differ depending on the user's location. Since this includes the entry of both display and tuning information, the entry procedure may be somewhat complex and may be the reason why this type of tuning system has not been fully accepted.

One possible difficulty that may be faced by a user is that he or she may not be aware of the condition of the memory. For example, if all of the limited number of memory locations contain information for corresponding tuning positions entry of information for an additional tuning position may cause previously stored information to be lost without the knowledge of the user. On the other hand, if none of the memory locations contains information corresponding to a tuning position, the receiver will not produce intelligible information for any selected channel and a user may be confused into thinking there is a major malfunction and, as a result, may initiate an unnecessary and costly service call.

SUMMARY OF THE INVENTION

In a tuning system including a memory having individual memory locations for storing information corresponding to a limited number of preferred tuning positions, means are included for examining the information stored in each of the memory locations to determine if it is all of a predetermined kind and if so causes display means to display a predetermined symbol representing that the memory is in a corresponding capacity condition. Thus, for example, if each memory location contains information corresponding to a tuning position, the letter F is displayed to indicate to a user that the memory is full and if each memory location contains nondesired information, the letter E is displayed to indicate to a user that the memory is empty.

In accordance with another feature of the present invention, the display means normally displays a number corresponding to the presently selected tuning position and is selectively caused to display the predetermined symbol in accordance with the capacity condition of the memory.

BRIEF DESCRIPTION OF THE DRAWING

FIGS. 2–16 show in logic diagram form various portions of the tuning system of FIG. 1;

FIGS. 18A and 18B show a state diagram indicating the logical operation of the implementation of the present tuning system shown in FIGS. 2–16.

Figure 1:
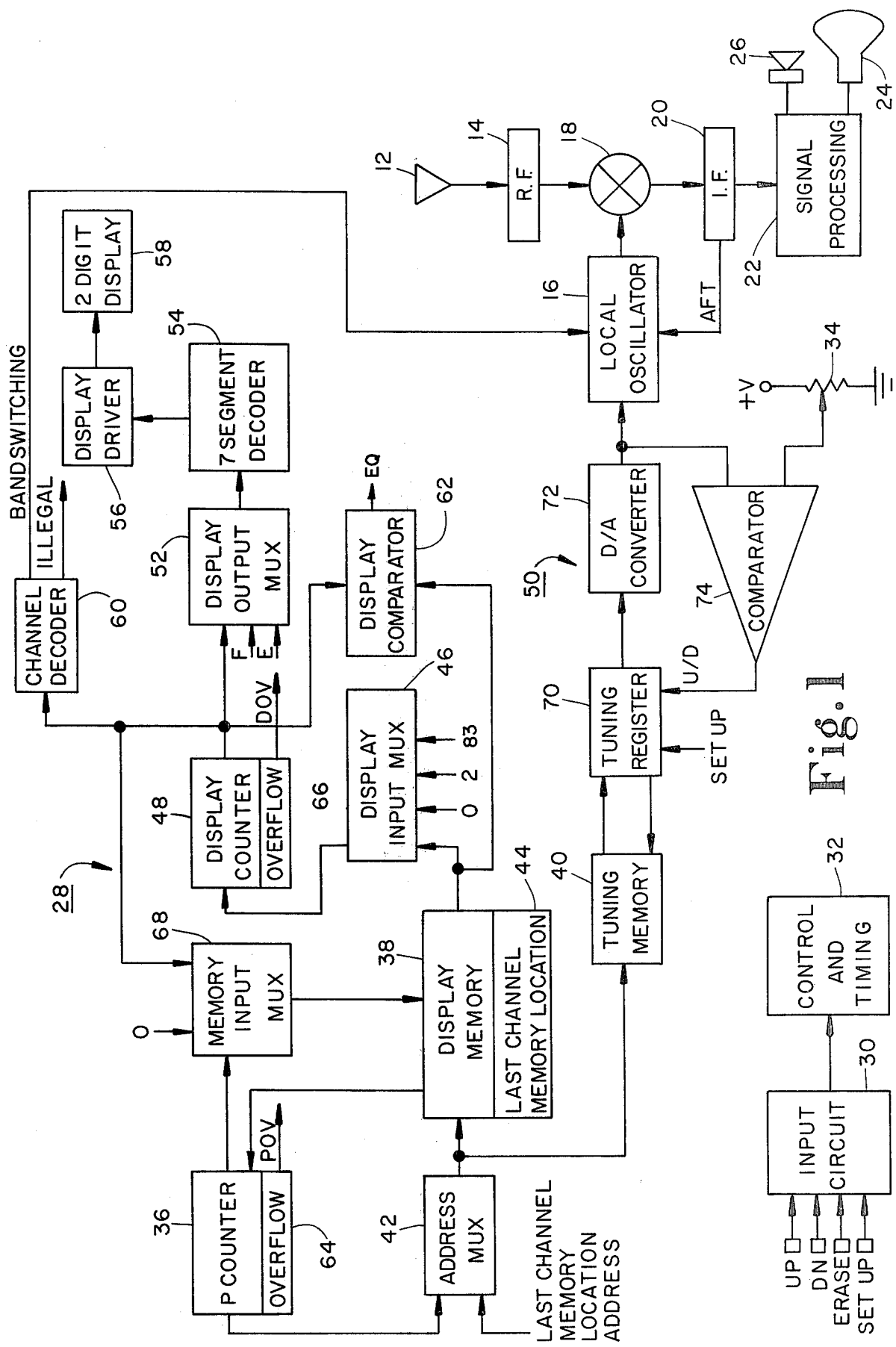
FIG. 1 shows in block diagram form a television receiver employing a tuning system constructed in accordance with the present invention.

In the television receiver of FIG. 1, radio frequency (RF) signals are received by an antenna 12 and amplified and otherwise processed by an RF input unit 14. The amplified and processed RF signals are combined with a local oscillator signal developed by a local oscillator 16 having a frequency corresponding to the presently selected channel in a mixer 18 to form an intermediate frequency (IF) signal. The IF signal is filtered and otherwise processed in an IF unit 20 and thereafter coupled to a signal processing unit 22 where signals representing synchronization, luminance, color and sound information are derived therefrom. In response to the synchronization, luminance and color information, an image is developed by means of a picture tube 24. In response to the sound information, an audio response is developed by means of a speaker 26.

The frequency determining element of local oscillator 16 includes at least one varactor diode which is reverse biased by a DC tuning voltage to exhibit a capacitance determined by the magnitude of the tuning voltage. Local oscillator 16 typically includes several varactor diodes corresponding to the various bands in which a selected channel may reside. For example, in the United States where channels 2 through 83 are partitioned into three bands, local oscillator 16 may include a varactor diode arrangement for the low VHF (VL) band including channels 2 through 6, another varactor diode arrangement for the high VHF (VH) band including channels 7 through 13 and still another varactor diode arrangement for the UHF band including channels 14 through 83.

The tuning voltage and the bandswitching signals for local oscillator 16 are derived by a memory type tuning system 28. Tuning system 28 includes a memory 38/40 with a location for storing binary signals representing information corresponding to a limited number of channels, e.g., 16, less than the total number of channels available in the television frequency range, e.g., 82. The information stored in each memory location is partitioned into a portion 38 for displaying the channel number and another portion 40 for generating the tuning voltage for a particular channel. Tuning system 28 is a content address tuning (CAT) system. This means that the tuning information may be stored in the memory locations in nonsequential order. That is to say, the information for channel 8 may be stored in the first memory location, the information for channel 20 may be stored in the secondary memory location, and the information for channel 2 may be stored in the third memory location, and so on.

In order to tune a particular channel, the number in a display counter 48 is changed in response to a viewer's command entered by means of an input control unit 30. At each count of display counter 48, memory 38/40 is searched for a memory location containing display information which is the same as that presently contained in display counter 48 by means of a display comparator 62 which compares the binary signals representing the selected channel number contained in display counter 48 and the binary signals contained in the display memory portion of each memory location. The memory is searched by sequentially changing the binary signals contained in an address or P (Pointer) counter 36. Each count of P counter 36 corresponds to the location or address of a memory location. When a match is found, the binary signals representing the channel number are read out of display memory portion 38 and displayed by means of a two-digit seven-segment display system including display output multiplexer (MUX) 52, seven-segment decoder 54, display driver 56 and two-digit display 58. In addition, the associated binary signals representing tuning information are read out of tuning memory portion 40 and converted to a corresponding tuning voltage by means of a tuning voltage generator 50.

A viewer controls the operating mode of tuning system 28 by means of four input switches on input control unit 30 corresponding to UP, DN (DowN), ERASE AND SETUP commands. Input control unit 30 and various other portions of tuning system 28 are coupled to a control and timing unit 32 which generates internal timing and control signals. Because of the complexity of these interconnections, they have been omitted from FIG. 1 but are shown in detail in FIGS. 2-16 showing the logic implementations of various portions of tuning system 28 and are described in functional terms below.

Normally, the binary contents of P counter 36 are coupled to memory 38/40 through an address multiplexer (MUX) 42 to address a particular memory location. However, when the receiver is first turned on binary signals representing the address of a last channel memory location 44 of display memory portion 38 are coupled through address MUX 42 to memory 38/40 to address last channel memory location 44 in which binary signals representing the address of the memory location in which binary signals representing information corresponding to the last channel selected before power was turned off are stored. The contents of last channel memory location are then coupled to P counter 36 so that the P counter addresses the memory location containing the information necessary to display the channel number tuned and generate the tuning voltage of the last channel selected before power was turned off. Thus, when power is initially turned on, the last channel selected prior to the removal of power is tuned.

A viewer may change the channel by either pressing the UP or DN button. In response display counter 48 is increased or decreased by a count of one. As earlier described, at each count of the display counter 48, P counter 36 is sequenced through the addresses for all the memory locations to search for a match between the contents of display counter 48 and the display memory portion of one of the memory locations. If no match is found in one complete search of all the memory locations, an overflow register 64 of P counter 36 will generate an overflow signal. In response to the generation of a P overflow signal, the contents of display counter 48 are increased by one (assuming that the UP switch was depressed), and another search sequence in which all the memory locations are examined for a match is initiated. If another P counter overflow signal is generated indicating that no match has occurred for that particular count of display counter 48, display counter 48 is again increased and display memory 38 is again searched for a match.

At each count of display counter 48, a channel decoder 60 determines if the count in display counter 48 corresponds to a "legal" channel number or not. That is, for example, in the United States, channel decoder 60 determines if the binary signals generated by display counter 48 corresponds to a number between 2 and 83. If not, an illegal signal is generated. Thus, if the UP switch has been depressed, and the count in display counter 48 is increased from 83 to 84, an illegal signal will be generated in response to which binary signals representing a 2 will be coupled through a display input multiplexer (MUX) 46 to display counter 48. Similarly, if the DN switch has been depressed, and the count in display counter 48 is decreased from 2 to 1, an illegal signal will be generated in response to which binary signals representing 83 will be coupled through display input MUX 46 to display counter 48. In this manner, the illegal signal generated by channel decoder 60 is utilized to cause illegal channel numbers in display counter 48 to "wrap" around from 83 to 2 when the contents of display counter 48 are being increased and from 2 to 83 when the contents of display counter 48 are being decreased. Channel decoder 60 also generated bandswitching signals to control the selection of the various varactor diodes in local oscillator 16 in accordance with the band in which the selected channel resides.

The search for a match in the aforesaid manner continues until each of the possible counts, e.g., 2 through 83, of display counter 48 has been tested for a match with the contents of the display portion of each memory location. If a match is found, the search is terminated and the contents of the memory location for which the match was found are read out and converted to tuning and display information in the aforesaid manner. If no match is found, it means that either no data has been previously entered in any of the memory locations or that all the memory locations have been erased, i.e., memory 38/40 is empty of information corresponding to any of the channels. When 82 numbers have been unsuccessfully searched for a match, a display counter overflow register 66 will generate a display counter overflow signal. With all the memory locations empty, the receiver will not produce a meaningful picture or sound for any selected channel. As a viewer may be confused in such a situation, to avoid an unnecessary service call, the display counter overflow signal is utilized by tuning system 28 in order to visually inform a viewer that the memory locations are all empty by means of causing the two-digit channel display 58 to an "E". Specifically, in response to the generation of a display counter overflow signal, a control signal is coupled to the display output MUX to cause the appropriate segments of the seven-segment display unit for one of the two-digit channel number displays to form the letter "E". A viewer is thereby informed that all the memory locations are empty of meaningful channel display and tuning information and he must therefore enter data. The letter "E" will also be displayed by the two-digit channel display unit 58 if upon power turn-on the contents of display memory portion of the memory location containing the last channel display and tuning information correspond to an illegal channel. This is so because in the present system, illegal channels will automatically be skipped. As a result, if the last channel display information corresponds to an illegal channel, it means that no channel display or tuning information has been entered and all the memory locations are empty.

To enter channel display and tuning information into display memory 38 and tuning memory 40, a viewer places the SETUP switch, which desirably is a slide or toggle type switch, in the ON position. At this point, the contents of the display memory portion of the memory location which presently is addressed in accordance with the contents of P counter 36 are coupled to display counter 48 through display input MUX 56 and examined by channel decoder 60 to determine if they correspond to a legal channel number or not. If the contents correspond to a legal channel number, the contents of P counter 36 are increased by one and the contents of the display portion of the newly addressed memory location are examined for legality. This process continues until an illegal entry is found in the display portion of a memory location. The search for an illegal entry in a memory location corresponds to a search for an unused or empty memory location into which new information may be entered since an illegal entry, i.e., one not corresponding to a channel between 2 and 83, does not represent desired information. When a memory location containing an illegal entry is found, binary signals representing the decimal number "00" are coupled through display input MUX 46 and display counter 48 to two-digit display unit 58 and through memory input MUX 68 to the channel display portion of the present memory location. The "00" display indicates to a viewer that unused memory location in which he may enter new data has been located. The viewer next adjusts the tuning voltage coupled to local oscillator 16 by means of potentiometer 34 of tuning voltage generator 50 until he is satisfied with the picture and sound produced by the receiver. Tuning voltage generator 50 generates binary signals representing the tuning voltage. Then, by means of either the UP or DN button, he changes the contents of display counter 48 until the channel number corresponding to the station tuned appears on two-digit channel display 58.

The viewer then turns the SETUP switch to the off position. At this point, the binary signals generated by display counter 48 and tuning voltage generator 50 is not immediately entered into the unused memory location. Rather, the address of the unused memory location is transferred from P counter 36 to last channel memory location 44 through the address MUX 42. This is done so that the contents of P counter 36 can be increased sequentially so that the contents of the display portions of all the memory locations can be compared with the contents of display counter 48 to determine if duplicate channel display information has already been entered in a memory location without losing the address of the unused memory location. If a duplicate of the channel display information contained in display counter 48 is found stored in a memory location, the new information is written into the memory location containing the previously stored duplicate information rather than in the unused memory location. If not, the address of the empty memory location is transferred from last channel memory location 38 to P counter 36 and the new display and tuning information is entered into the memory location addressed by the contents of P counter 36. In this manner, last channel memory location 38 is utilized as a temporary storage location during a search of the memory locations to prevent multiple entries in memory 38/40. This prevents a user or viewer from unnecessarily using up memory locations to store the same information twice, thereby decreasing the number of available memory locations. This has the added advantage in that it prevents the storage of different tuning voltage information for the same channel. In other words, if multiple entries were not prevented, it is possible that different tuning voltages, depending on the viewer's initial setup for the same channel, would be generated when the viewer depressed the UP or the DN switch to reach the desired channel.

During the setup operation, if the contents of P counter 36 have been sequentially increased by one a number of times equal to the total number of memory locations in memory 38/40, each memory location will have been examined by channel decoder 60 to determine if it contains nondesired information, i.e., if its contents correspond to an illegal channel number. If no illegal channel number is detected, memory 38/40 is full and the entry of information for a new channel will be written over previously stored channel display and tuning information and the previously stored channel information will thereby be lost. To inhibit a viewer from undesirably entering new channel information into a full memory, tuning system 28 provides the viewer with a visual indication that the memory is full. Specifically, when P counter 36 has counted a number of times at least equal to the total number of memory locations excluding last channel memory location 44 (i.e., less one), P counter overflow register 64 will generate a P counter overflow signal. In response, if the SETUP switch is in the ON position, control and timing unit 32 will generate a control signal to cause display output MUX to couple binary signals to seven-segment decoder 54 which in turn causes the segments of one of the two digits of channel number display 58 to form the letter "F."

At this point, new channel information can only be entered if previously entered channel information for one of the channels is erased. Erasure of previously entered channel information is accomplished in the following way. In the normal viewing mode, the viewer presses the UP or DN switch until the channel to be erased is reached. The viewer then depresses the ERASE switch. At this point, a binary signal corresponding to the decimal number "00" is coupled through memory input MUX 68 to the display memory portion of the memory location corresponding to the channel to be erased. Tuning system 28 then causes the memory location for the next higher channel to be located and tuned, at which point the viewer may watch or erase that channel.

Now that a description of the tuning system 28 shown in block diagram form has been given, a somewhat more detailed description of its implementation will be presented.

Tuning voltage generator 50 comprises a tuning register 50 coupled between the output of tuning memory 40 and a digital to analog (D/A) converter 72. The output of D/A converter 72 is the tuning voltage for local oscillator 16. During normal viewing conditions, the tuning voltage is modified to correct for component drift by an automatic fine tuning (AFT) voltage generated by a portion of IF unit 20. During the setup mode, when the SETUP switch is in its ON position, a viewer adjusts setup potentiometer 34 until acceptable picture and sound result. The contents of tuning register 70, comprising an up/down counter, are increased or decreased in response to the output voltage state of a voltage comparator 74 until the DC output signal of D/A converter 72 is substantially equal to the DC signal developed at the tap off point of potentiometer 34. Since the viewer has adjusted potentiometer 34 until the desired picture and sound are produced, at this point the contents of register 70 correspond to the tuning voltage. When the SETUP switch is placed in the OFF position, the contents are stored in a memory location of tuning memory 40 as earlier described.

Memory 38/40 is a read/write random access memory (RAM) which may be of the nonvolatile type such as described in the aforementioned article by Lester Penner, or may be of a volatile type wherein information maintained during the absence of power by a standby power supply including a battery, such as is described in the aforementioned Magnavox Service Manual. In either case, memory 38/40 includes a number of memory locations for storing channel information equal to the number of channels, e.g., 16, for which it is desired to store information and an additional last channel memory location 44 for storing the address of the memory location containing the tuning and display information of the last channel tuned prior to the absence of power. Each of the memory locations, other than last channel memory location 44, contains four memory cells for storing the BCD (Binary Coded Decimal) signals for the least significant digit (LSD) of the corresponding channel number and four cells for storing the BCD signals for the most significant digit (MSD) of the corresponding channel number. These portions of memory 38/40, as previously indicated has been labeled 38 for purposes of explanation. The remaining portion of each memory location contains a number of cells, e.g., 12, for storing the binary signals for generating the corresponding tuning voltage with suitable resolution. Since last channel memory 44 may store an address of any one of the 16 memory locations containing the last channel display and tuning information, it includes only enough cells, e.g., 4, to store the BCD signals representing one of the 16 possible addresses.

Figure 2:
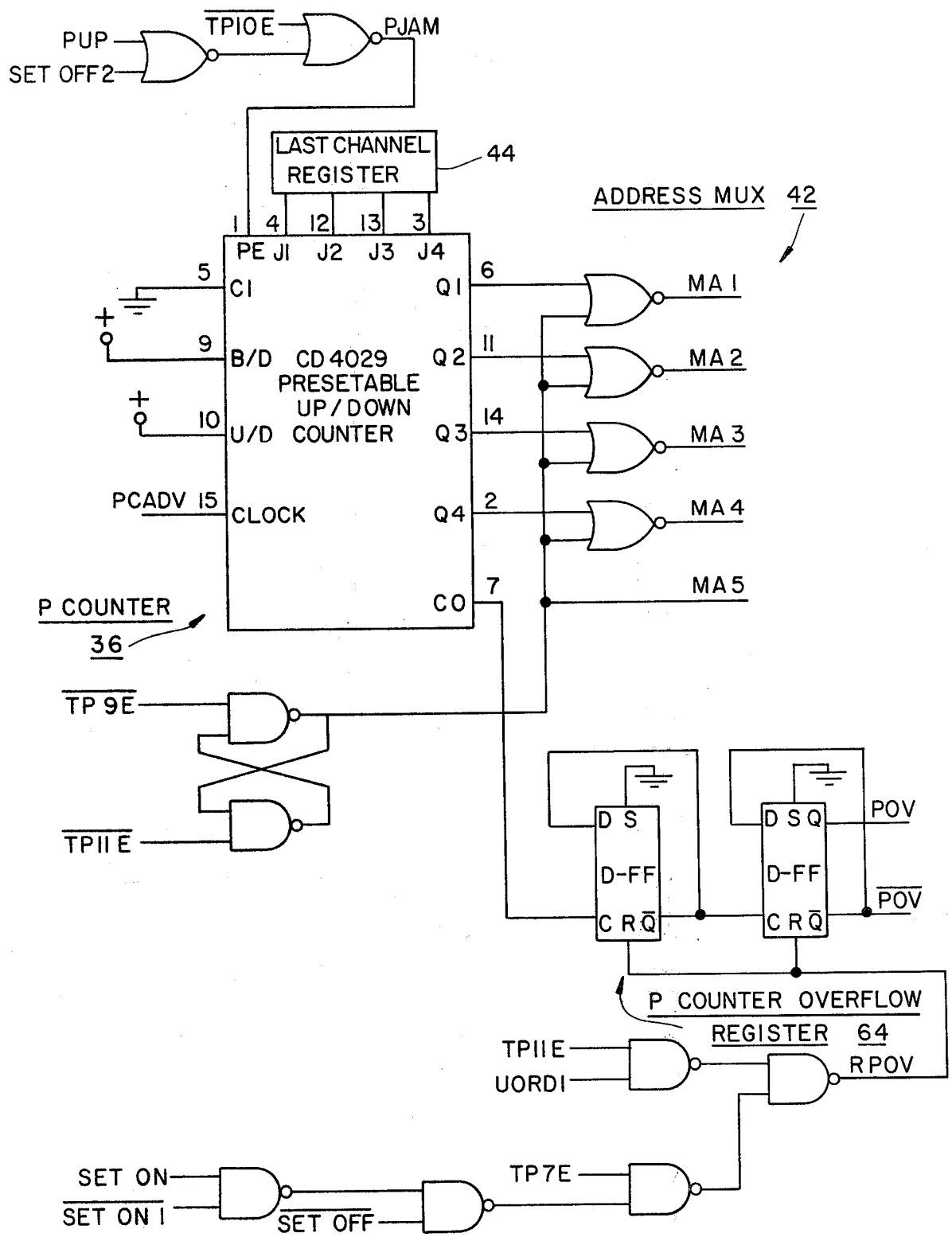

Logic implementations of P counter 36, P counter overflow register 64 and address MUX 42 are shown in FIG. 2. P counter 36 includes a CD4029 presettable Up/down counter C-MOS (Complementary Metal Oxide Semiconductor) integrated circuit available from the RCA Corporation. P counter 36 is a 4-bit (binary digit) register which in response to successive P counter advance (PCADV) signals counts through 16 states corresponding to the 16 memory locations of memory 38/40.

When a count corresponding to 16 is reached, a carry out (CO) signal advances the count of a 2-stage P counter overflow register 64, comprising two cascaded D-type flip-flops (D-FF) to 1. When P counter 36 again counts to 16, its CO signal of advances the count of overflow register 64 to 2 and a P counter overflow signal (POV) is generated. Overflow register 64 comprises two stages to insure that every memory location has been accessed at least once during a search routine before a POV signal is generated because it is not known which memory location is addressed, when a memory search routine is initiated. Thus, for example, if the search is initiated at a count corresponding to the fifth memory location, when 16 is reached, four more memory locations need to be searched before every memory location has been examined. Therefore, a POV signal, indicating that at least one complete search has been completed, is not generated until a count of 16 has been accumulated twice in succession.

Normally, the $Q_1$-$Q_4$ outputs are coupled to memory 38/40 through address MUX 42, comprising four NOR gates, as memory address signals MA1-MA4. However, in response to certain timing signals, as will later be described, a MADM signal is generated and five logic "0" signals are coupled through address MUX 42 as MA1-MA5 to address the location of a seventeenth memory location of memory 38/40 which serves as last channel memory location 44. In response to a P counter jam (P JAM) signal, the contents of last channel memory location 44 are entered, through jam inputs $J_1$-$J_4$, into P counter 36.

In FIG. 2 and subsequent figures, certain control and timing signals such as RPOV (Reset P counter OVerflow register) are identified. Their generation and use will later be discussed with reference to the timing diagram of FIGS. 18A and 18B.

The logic implementation of memory input MUX 68 shown in FIG. 3 comprises two CD4019 C-MOS integrated circuits available from RCA Corporation. In response to the application of an MIKA (Memory Input KA) signal to the KA control terminal, the binary signals generated by display counter 48, DC1-DC8, coupled to the A input terminals of the CD4019 IC's are transferred through its D output terminals to display memory portion 38 as MDI (Memory Display Input) 1-MD18 in response to the application of the appropriate timing pulse (TMP10) to the KB control terminal, the 4-bit contents of P counter 36, P1-P4, coupled to the B input terminals are transferred to display memory portion 38. If the signals coupled to KA and KD inputs are both logic "0's", logic "0's" will be entered in display memory portion 38.

In the logic implementation of display input MUX 46, the contents, MD01-MD02, of a particular memory location within display memory portion 38 are transferred to the jam inputs (J1-J8) of display counter 48. When the DN switch has been pressed causing the generation of a DN signal, and the contents of display counter 48 correspond to 1, binary signals corresponding to the decimal number 83, rather than 1, will be transferred to display counter 48. When the UP switch has been pressed causing the generation of a DN signal and the contents of display counter 48 correspond to 84, binary signals corresponding to 2, rather than 84, will be transferred to display counter 48.

Figure 5A:
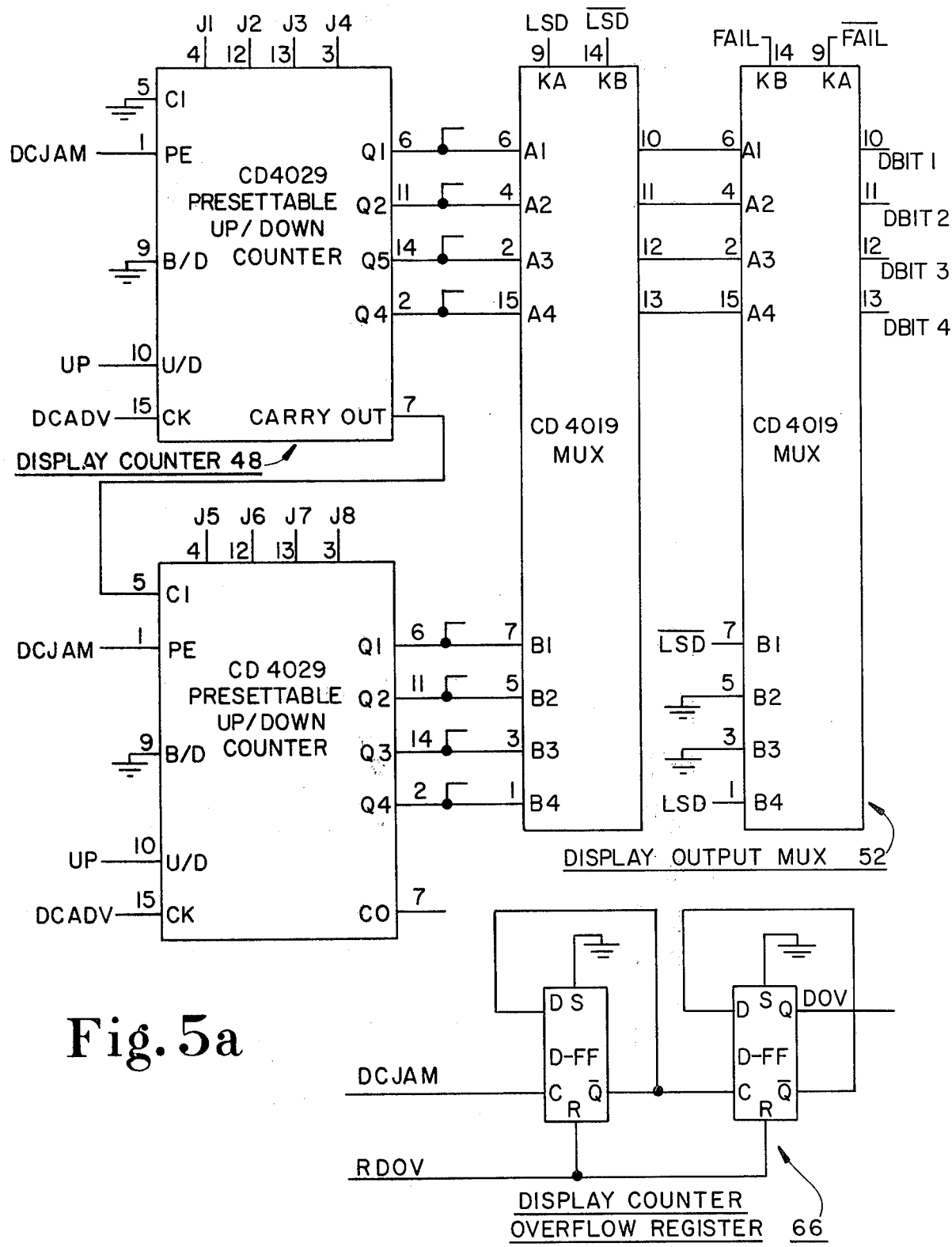
Figure 5B:
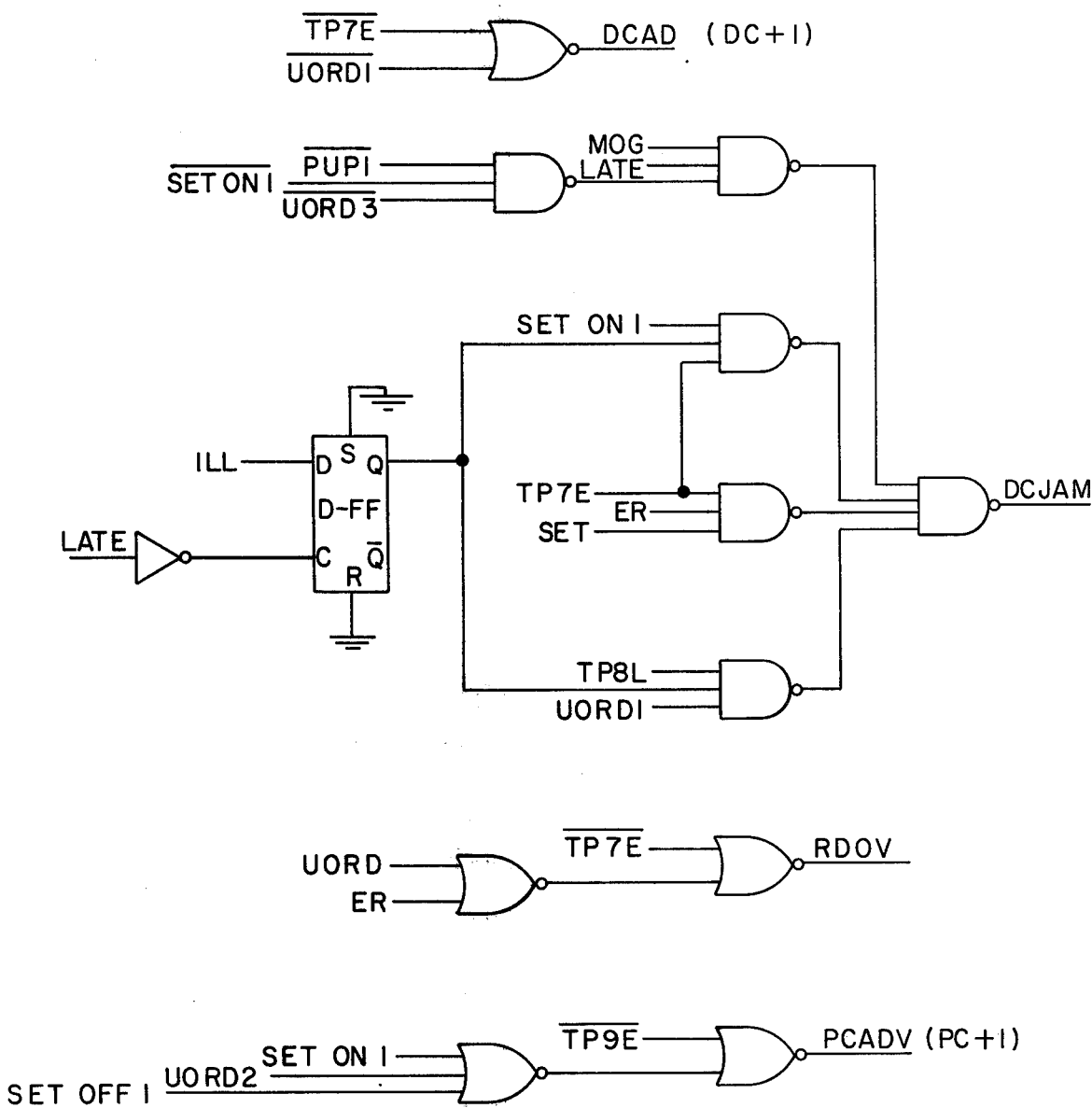

FIGS. 5a and 5b show logic implementations of display counter 48 and its control logic, display counter overflow register 66 and display output MUX 52. Display counter 48 comprises a first CD4029 presettable up/down counter for the binary signals representing the least significant digit of two digit channel number display 58 and a second CD4029 for the binary signals representing the most significant digit of two-digit channel number display 58. The binary signals J1–J4 representing the least significant digit stored in a memory location of display memory portion 38 are coupled to the jam input terminals of the first CD4029 IC and entered in response to the application of a DC JAM (Display Counter JAM) signal to the PE (Preset Enable) terminal of the CD4029. The binary signals J5–J6 representing the most significant digit stored in a memory location of display memory portion 38 are coupled to the jam inputs of the second CD4029 IC and also entered in response to a DC JAM signal. The carry out (CO) signal of the first CD4029 is coupled to the carry in (CI) of the second to form a dual decade counter. When a UP (i.e., $\overline{DN}$) signal is generated in response to the depression of the UP switch, the contents of display counter 48 are increased by one in response to each DCADV (Display Counter ADVance) signal. In response to a DN signal, the contents of display counter 48 are decreased by one in response to each DCADV signal.

Display counter overflow register 66 comprises two D flip-flops cascaded to generate a display counter overflow (DOV) signal in response to two successive DC JAM signals without the generation of a RDOV (Reset Display counter OVerflow) signal. Since a DC JAM signal occurs each time the upper or lower end of the range of legal channel numbers is traversed, i.e., each time the decimal number 1 has been counted when the DN switch has been depressed and each time the decimal number 84 has been counted when the UP switch has been depressed, the generation of a DOV signal indicates that at least each of the count states of display counter 48 corresponding to a legal channel number have been counted. Here, as in the implementation of P counter overflow register 64 of FIG. 2, two D flip-flops are utilized since it is not known when a search sequence is initiated, and it is therefore necessary to count through a count corresponding to one end of the counting range at least twice to ensure the entire range has been searched. Display counter overflow register 66 is responsive to DCJAM signals rather than the CO signal of the second CD4029 because the CO signal of the second CD4029 is only generated at a count corresponding to 99, a number never reached because of the wrap around feature earlier described.

Display output multiplexer 52 comprises two cascaded CD4019 integrated circuits. The first CD4019 couples binary signals generated by display counter 48 corresponding to the lower significant digit of the display to the second in response to a LSD timing signal and couples the binary signals corresponding to the most significant digit of the display to the second multiplexer in response to a $\overline{LSD}$ (i.e., MSD) signal. The second CD4029 IC normally, i.e., when a $\overline{FAIL}$ signal has been generated, couples the binary signals received from the first to seven-segment decoder 54 as DBIT (Display BIT) 1–4. Thus, the binary signals corresponding to lower significant and most significant digits are multiplexed. This allows the use of a single seven-segment decoder arrangement rather than one for each digit and thereby effects a cost savings. If a FAIL signal has been generated, as will be explained later, in response to either the detection of an empty or full memory condition, during the LSD timing interval, binary signals representing the decimal number 8 are coupled to display decoder 54. If a FAIL has been generated, during the $\overline{LSD}$ timing interval, binary signals representing the decimal number 1 are coupled to display decoder 54. Thus, in response to a FAIL signal, without more as will be explained later with reference to the logic implementation of display decoder 54 of FIG. 6, the decimal number 18 would be displayed by means of channel display 58.

Figure 6:
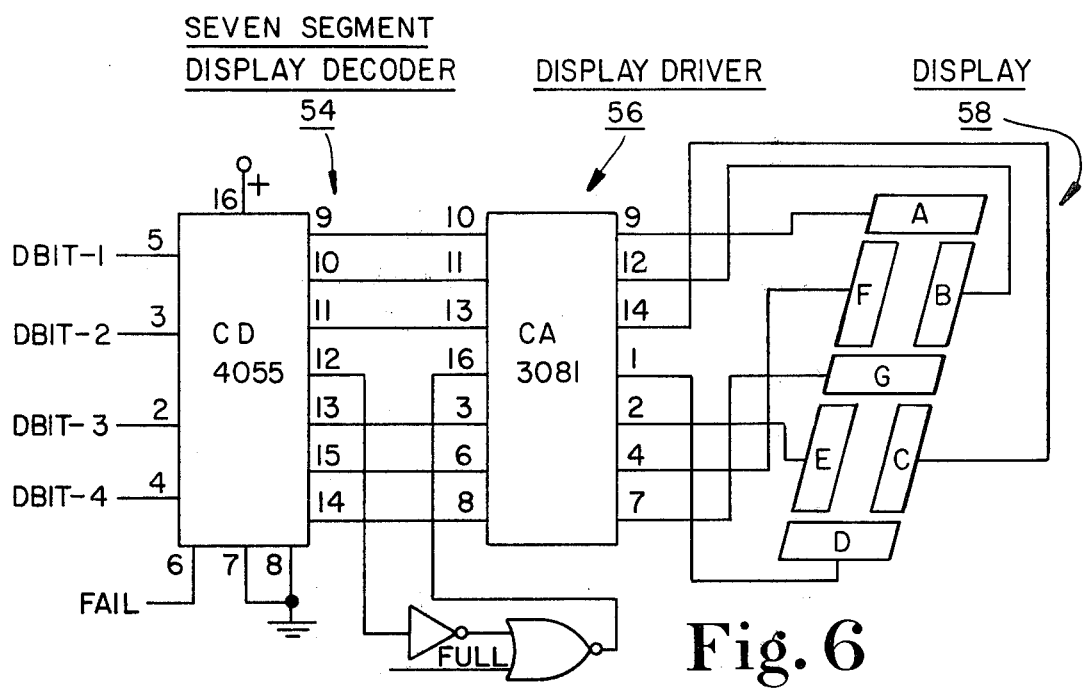

Referring now to FIG. 6, the logic implementations of display decoder 54 comprises a CD4055 C-MOS integrated circuit and display driver 56 comprises a CA3081 integrated circuit, both integrated circuits being available from RCA Corporation. In response to a FAIL signal, the CD4055 integrated circuit inverts the seven-segment binary output coupled to display driver 56. Therefore, in response to a FAIL signal, in the most significant digit position of two digit display 58, all the segments except the segments corresponding to the decimal number 1 will be illuminated (i.e., segments, A, F, G, E and D of the most significant digit of the digit display 58 will be illuminated and segments B and C will not) to form the letter E, and in the least significant position, none of the segments will be illuminated to form a blank. If a full memory condition has been detected, a FULL signal will be generated. In response to a FULL signal in addition to a FAIL signal, all the segments necessary to form the letter E except segment D will be enabled to be illuminated thereby causing the letter F to be displayed.

Figure 7:
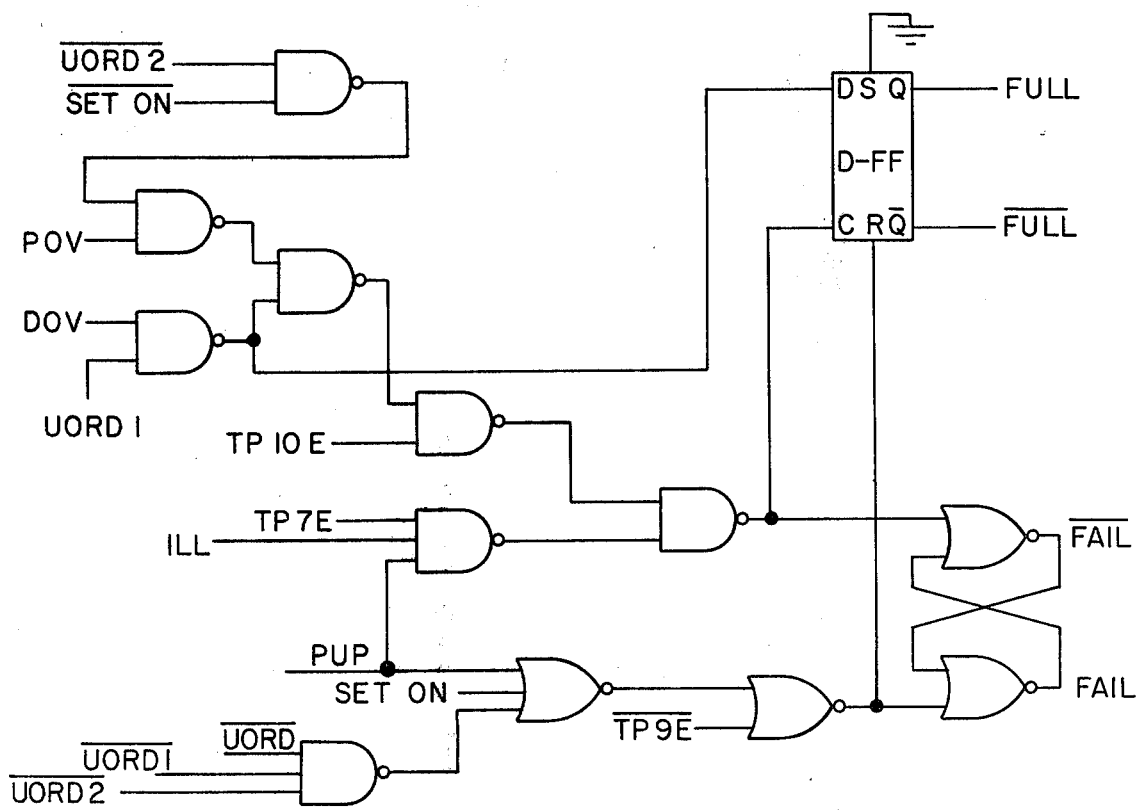

The logic for generating FAIL and FULL signals is shown in FIG. 7. The detailed description of this logic arrangement is provided by the timing diagram of FIGS. 18A and 18B. Briefly, a set-reset flip-flop comprising two cross coupled NOR gates will be set to generate a FAIL signal when the UP or DN (UORD) switch has been depressed in response to the generation of a DOV signal by display counter overflow register 66 and when power is reapplied during a power up (PUP) sequence in response to the determination that the memory location corresponding to the last channel tuned before power was removed contains an illegal (ILLEGAL) channel number. Under these conditions the FAIL signal corresponds to an empty memory condition. Furthermore, the FAIL signal will be generated when the SETUP switch is in its on position (SETON) and a POV signal is generated by P counter overflow register 64. This condition corresponds to a full memory condition and accordingly a D flip-flop is set to generate a FULL signal.

The output signals of display counter 48, in addition to being coupled to display MUX 52 are coupled to channel decoder 60 and display comparator. Logic implementation for accomplishing the function of these units are well known in the art and will not be described in detail. For example, channel decoder 60 may comprise a read only memory (ROM) such as disclosed in U.S. Pat. No. 4,024,476 issued in the name of George Briggs on May 17, 1977, hereby incorporated by reference, and display comparator G2 may include two CD4063 C-MOS 4-bit magnitude comparator integrated circuits available from RCA Corporation.

Input circuit 30 comprises arrangements (not shown) as are well known for generating KU (Key UP), KD (Key DOWN), KE (Key ERASE) and KS (Key SETUP) signals when the respective switches, UP, DN, ERASE and SETUP are operated. In addition, to inhibit unreliable operation due to switch bouncing, input unit 50 generates a KGOOD signal only after an operated switch is in a stable condition.

Figure 17:
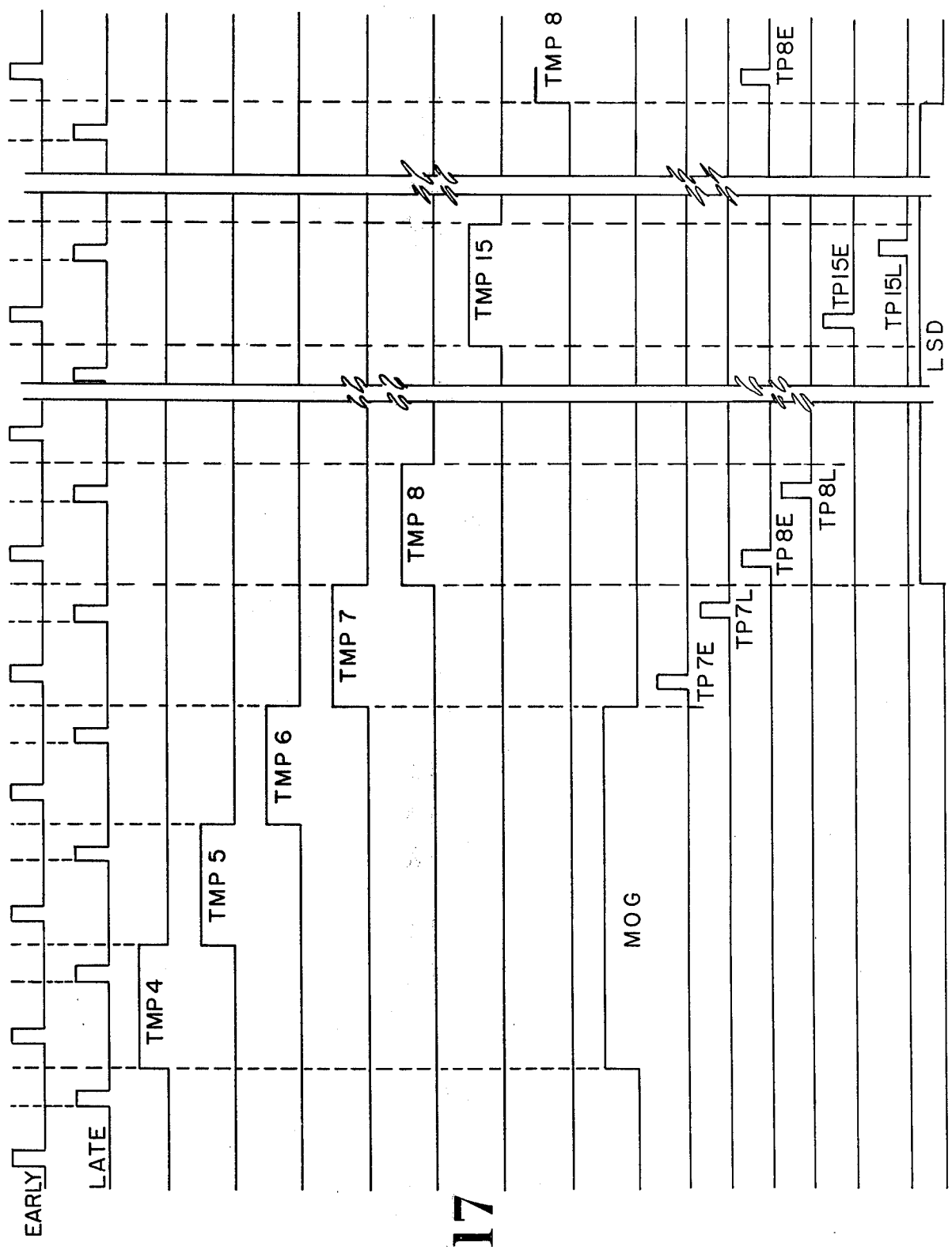
FIG. 17 shows a graphical representation of various timing signals generated in the tuning system of FIG. 1.

Control and timing unit 32 is responsive to the KU, KD, KE, and KS signals to cause tuning system 28 to operate in certain modes or states. Within each operating state (see FIGS. 18A and 18B), at predetermined times corresponding to the occurrence of timing pulses (see FIG. 17), the portion of tuning system 28 so far described are caused: to make certain determinations, e.g., whether a match (EQ) between the contents of display counter 48 and the contents of a memory location of display memory 38 has occurred or whether an empty or full memory condition (FAIL) has occurred; transfer information from one unit to another by means of the multiplexers; change the contents of one of the various counters; read (LOAD) information from memory 38/40 or write (STORE) information into the memory; shift from one mode of operation to another; or be reset to await the action of a viewer.

Figure 8:
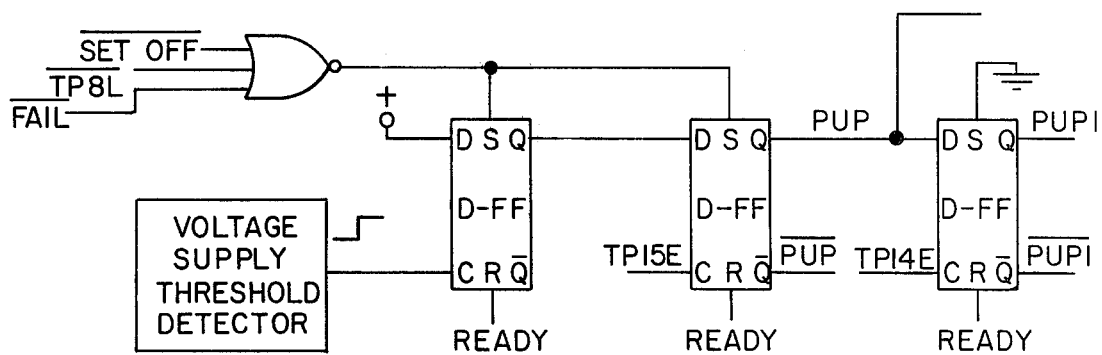
Figure 9:
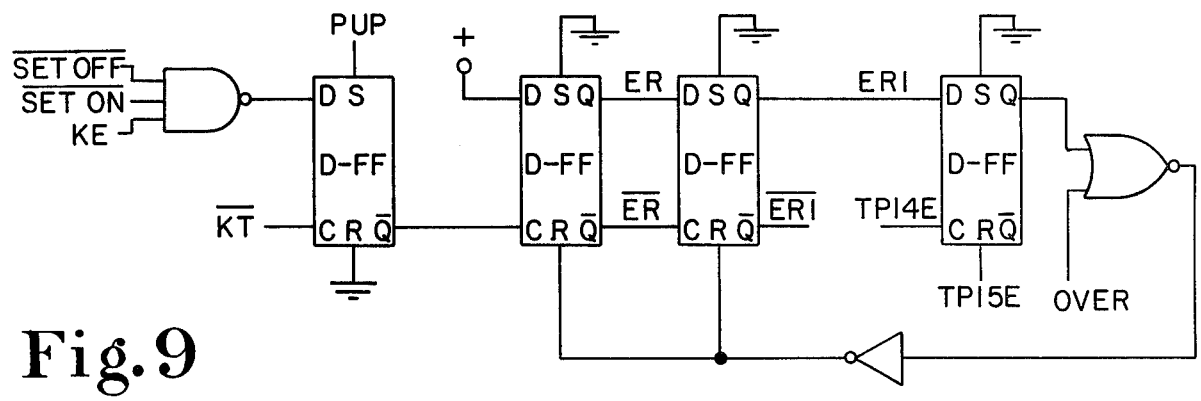
Figure 10A:
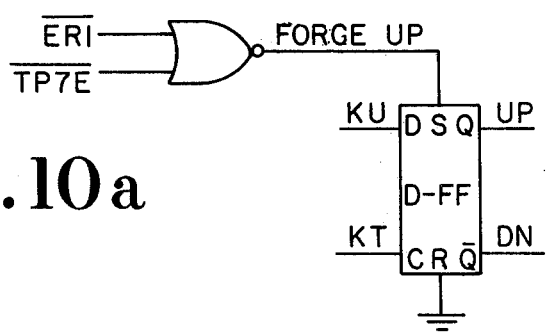
Figure 10B:
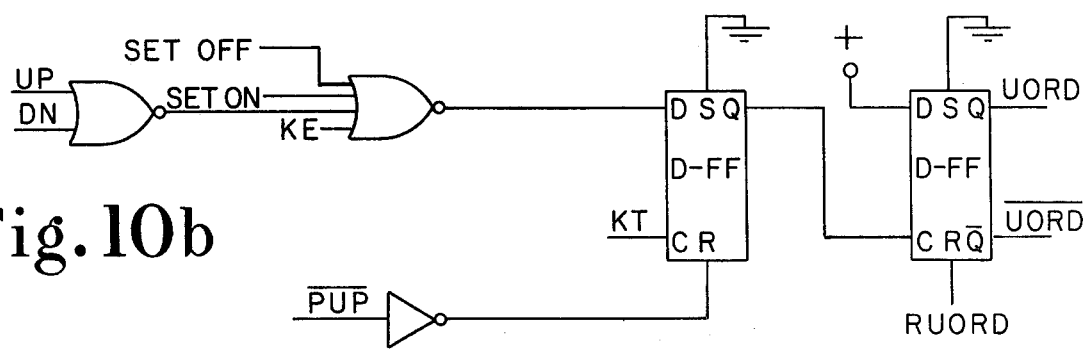
Figure 10C:
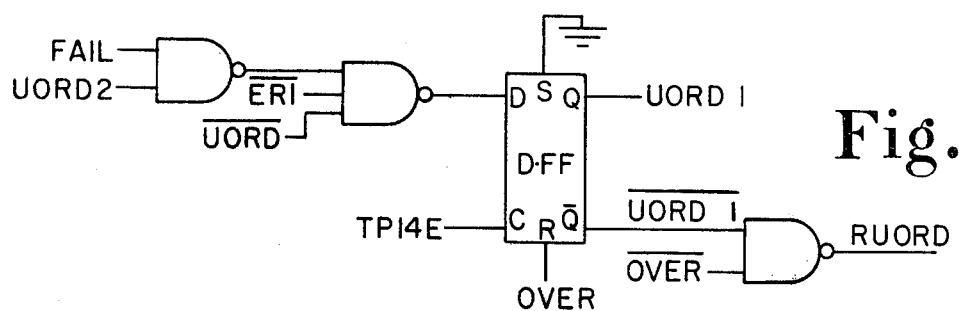
Figure 10D:
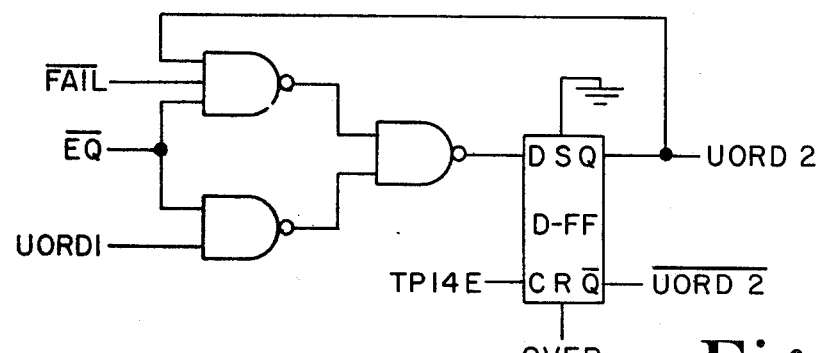
Figure 10E:
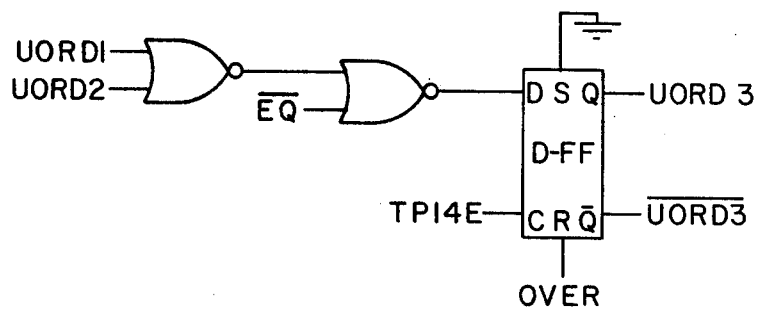
Figure 11:
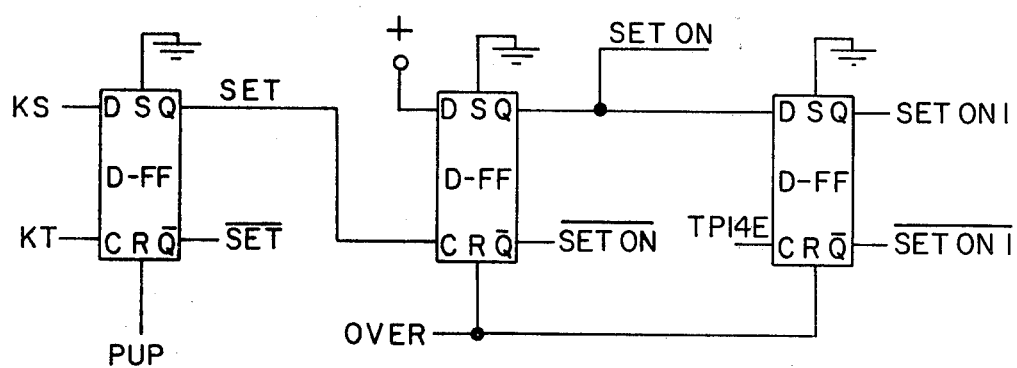
Figure 12A:
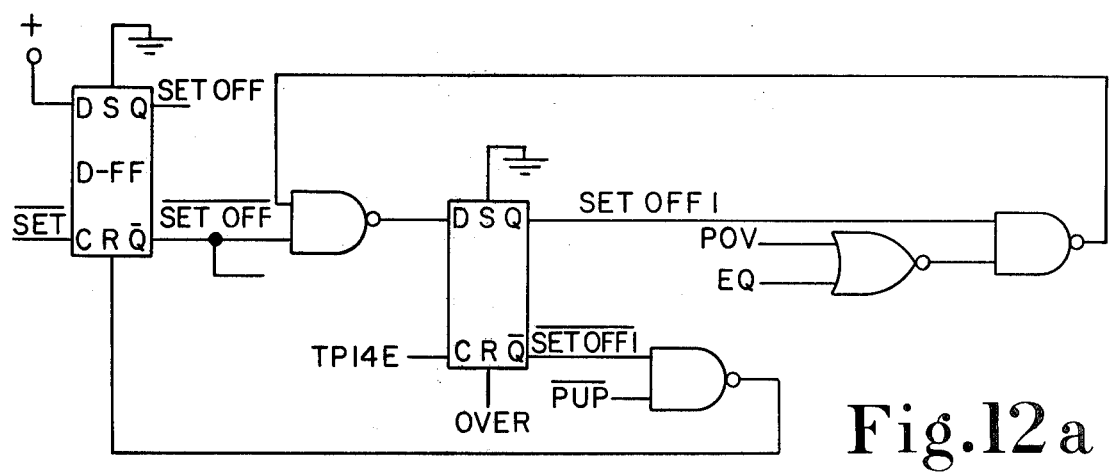
Figure 12B:
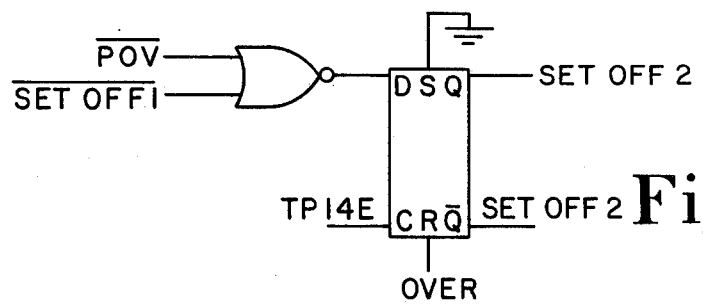
Figure 12C:
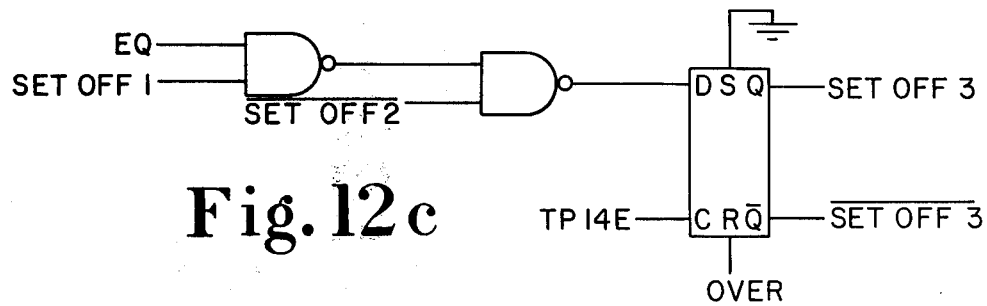

Control and timing unit 32 contains logic to cause tuning system 28 to operate in five major states, each including at least one substate. The states are: PUP (Power UP sequence) and PUP1; SETON (SETUP switch placed in the ON position) and SETON 1; UORD (UP or DN switch depressed), UORD1, UORD2 and UORD3; ER (ERASE switch depressed) and ER1; SETOFF (SETUP switch placed in the OFF position after being in the ON position). When an operating state is initiated, a corresponding flip-flop is set. The logic of control and timing unit 32 that controls the setting and resetting of these state flip-flops is shown in the following FIGS:

FIG. 8 — PUP and PUP1;
FIG. 9 — ER and ER1;
FIG. 10A, B, C, D, E — UORD and UORD1-3;
FIG. 11 — SETON and SETON1;
FIG. 12A, B, C — SETOFF, SETOFF1-3.

Figure 13:
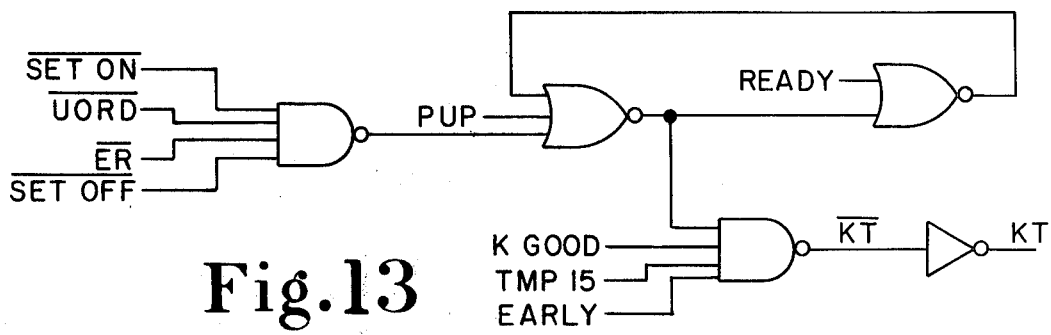

The logic shown in FIG. 13 controls the time (KT) when the circuits of FIGS. 8-12 will respond to the operation of a switch. Assuming a KGOOD signal has been generated, the switch conditions will be examined after a timing pulse TP15E (corresponding to the "ANDing" of timing pulses TMP15 and EARLY). However, the state circuits will be inhibited from responding to new switch information when tuning system 28 is in one of its operating states as manifested by the set condition of one of the state flip-flops.

FIG. 14 shows the logic arrangement of timing and control unit 32 for generating a READY signal which places the logic of tuning system 28 in a hold condition until a viewer takes further action by operating one of the input switches. The READY signal serves to reset flip-flops in various portions of tuning system 28. Since the portions of tuning system 28 are also reset after a power up (PUP) sequence, to save logic elements the PUP and READY signals are logically "ORed" to generate an OVER signal for resetting these portions.

FIGS. 15 and 16 show the logic implementations for generating a LOAD signal and a STORE signal respectively. In response to a LOAD signal information is read from the memory. In response to a STORE signal, information is written into the memory.

The timing pulses generated by timing and control unit 32 are generated by counters (not shown) which synchronously divide the frequency of a clock signal. The timing pulses utilized by the logic shown in FIGS. 2-16 are graphically depicted in FIG. 17.

The operation of the logic implementations may readily be understood by reference to the state diagrams shown in FIGS. 18A and 18B. The logical operations that occur at each timing pulse, represented by a corresponding row, during a particular state of operation, represented by a corresponding column, are indicated within the block defined by the respective row and column. The timing pulses repeat, i.e., at the end of TMP 15 the TMP 1 is generated. TMP 1-3 are unused. Although substantially all of the signals and operation nomenclature has previously been discussed, listed below is a glossary to facilitate an understanding of the state diagram of FIGS. 18A and 18B.

GLOSSARY

The following terms appear in alphabetical order. In the state diagram an arrow means either go to the indicated state or go to a specified condition. For example of the latter, ILL→FAIL means if an ILLEGAL (ILL) signal has been generated, set the FAIL flip-flop and SET→DC = 0 means if in the SETUP switch is in the on position (SET) transfer a binary signal corresponding to the decimal number "00" to display counter 52.

A: output of address MUX 42.
DC: contents of display counter 48.
DCADV: increase contents of display counter 48 by 1 (DC = DC+1).
DCJAM: enter output of display input MUX 46 into display counter 48.
DOV: display counter overflow signal.
EQ: a match between the contents of display memory portion 38 and display counter 48 exists.
$\overline{EQ}$: a match between the contents of display memory portion 38 and display counter 48 does not exist.
FAIL: a signal generated by a corresponding flip-flop.
FIX ILLEGAL DC: cause the contents of the display counter to wrap around from 83 to 2 if UP has been pressed or from 2 to 83 if DN has been pressed.
FORCE UP: force the counting sequence of display counter 48 to be up.
ILL: illegal channel number
LOAD: read contents of display memory portion 38 into display counter 38 and contents of tuning memory portion 40 into D/A system 50.
M. INP. MUX: memory input MUX 68.
PC: contents of P counter 36.
PCADV: increase contents of P counter 36 by 1 (PC = PC+1).
PJAM: enter output of display memory portion 38 into P counter 36.
POV: P counter overflow signal.
PUA: power up address, i.e., the address of the last channel memory location 44.
READY: the sequence of operation complete and tuning system is awaiting a further viewer instruction.
SET: a signal representing that the SETUP switch is in the on position.
STORE: write the contents of display counter 48 in display memory portion 38 and write contents of tuning register 70 in tuning memory portion 40.

What is claimed is:

1. An apparatus for tuning a receiver to a predetermined number of preferred tuning positions less than all the tuning positions available in a predetermined tuning range, comprising:

memory means including a number, equal to said predetermined number of preferred tuning positions, of memory locations for storing binary signals;

control means for selectively entering binary signals into one of said memory locations during an entry control mode and retrieving binary signals from one of said memory locations during a retrieval control mode;

means for examining the binary signals contained in each of said memory locations and generating a fail signal during one of said control modes when each of said memory locations contains binary signals representing infomation of a predetermined kind and that said memory means is in a predetermined condition;

display means responsive to said fail signal for displaying a predetermined symbol representing said predetermined condition.

2. The apparatus recited in claim 1 wherein said display means comprises display control means for normally causing said display means to display a number corresponding to one of said tuning positions and in response to said fail signal displaying a letter representing said predetermined condition.

3. The apparatus recited in claim 2 wherein said means for examining the binary signals contained in each of said memory locations during said entry control mode generates said fail signal when each of said memory locations contains binary signals representing information corresponding to one of said tuning positions and additionally generates a full signal representing that said memory means is in a full condition; and said display control means causes said display means to display the letter "F" in response to the generation of said fail and full signals.

4. The apparatus recited in claim 3 wherein said means for examining the binary signals contained in each of said memory locations during said retrieval control mode generates said fail signal when each of said memory locations contains binary signals representing nondesired information and additionally generates an empty signal representing that said memory means is in an empty condition; and said display control means causes said display means to display the letter "E" in response to said fail and empty signals.

5. The apparatus recited in claim 4 wherein each of said memory locations has its location within said memory means identified by a corresponding address;

said control means includes address counter means for generating binary signals representing the address of each of said memory locations so that binary signals may be entered therein and retrieved therefrom;

said means for examining the binary signals contained in each of said memory locations includes decoder means cooperative with said address counter means for generating a desired signal when the binary signals contained in a presently addressed memory location represents information corresponding to one of said tuning positions, said address counter means generating the binary signals representing the next address in response to the generation of said desired signal, said address counter means generating an address counter overflow signal when binary signals representing all the addresses of all of said memory locations have been generated, said means for examining the binary signals contained in each of said memory locations generating a fail signal in response to said address counter overflow signal and during said entry mode generating said full signal in response to said fail signal.

6. The apparatus recited in claim 5 wherein each of said memory locations includes a portion for storing binary signals representing a tuning position number corresponding to one of said tuning positions; and said decoder means generates a desired signal unless the binary signals contained in said display portion of said presently addressed memory location represent information other than a tuning position number corresponding to one of said tuning positions in said predetermined tuning range.

7. The apparatus recited in claim 5 wherein said address counter means includes an overflow register for generating said address counter overflow signal when the binary signals generated by said address counter means corresponding to a preselected value have been generated at least twice in succession.

8. The apparatus recited in claim 7 wherein said control means includes input counter means for generating binary signals representing information corresponding to said tuning positions;

said means for examining the binary signals contained in each of said memory locations includes comparison means cooperative with said address counter means for comparing the binary signals presently generated by said input counter means and the binary signals contained in each of said memory locations and generating a not equal signal unless a presently addressed memory location contains binary signals representing information corresponding to the tuning position represented by the binary signals presently generated by said input counter means, said address counter means generating the binary signals representing the next address in response to the generation of said not equal signal, said input counter means generating the binary signals representing information corresponding to the next tuning position in response to the generation of said address overflow signal, said input counter means generating an input counter overflow signal when binary signals representing information corresponding to all the tuning positions have been generated, said means for examining the binary signals contained in each of said memory locations generating a fail signal in response to said input counter overflow signal and during said retrieval mode generating said empty signal.

9. The apparatus recited in claim 8 wherein each of said memory locations includes a portion for storing binary signals representing a tuning position number corresponding to one of said tuning positions;

said input counter means generates binary signals representing the tuning position numbers corresponding to said tuning positions; and said comparator means generates a not equal signal unless the binary signals contained in the display portion of a presently addressed memory location are equal to the binary signals presently generated by said input counter means.

10. The apparatus recited in claim 8 wherein said input counter means includes an overflow register for generating said input counter overflow signal when the binary signals corresponding to a preselected value have been generated at least twice in succession.

11. The apparatus recited in claim 5 wherein said display means includes means for forming the numbers zero through nine by enabling selected ones of an array including seven bar segments A through G, said segments A through F being arranged in clockwise order as a parallelogram with said segment A in parallel with said segment D, said segments B and C in general alignment with each other, said segments F and E in general alignment with each other, said segments B and C parallel to and opposite segments F and E, said segment G spanning between the juxtaposed ends of said segments B and C and the juxtaposed ends of said segments F and E;

said control means causing said letter E to be formed by causing all of said segments to be enabled except said segments B and C;

said display control means causing said letter F to be formed by causing all of said segments to be enabled except said segments B, C and D.

* * * * *